United States Patent
Churchill et al.

(10) Patent No.: US 6,803,799 B1
(45) Date of Patent: Oct. 12, 2004

(54) LOW POWER FLIP FLOP

(75) Inventors: Simon Churchill, Whitchurch (GB); Richard Nicholson, Thruxton (GB)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 10/452,683

(22) Filed: May 30, 2003

(51) Int. Cl.[7] .............................................. H03K 3/289
(52) U.S. Cl. ........................ 327/202; 327/203; 327/218
(58) Field of Search .............................. 327/199, 202, 327/203, 208, 214, 206, 218, 207, 210, 211, 212, 197

(56) References Cited

U.S. PATENT DOCUMENTS 5,525,921 A * 6/1996 Callahan ..................... 327/144
6,046,604 A * 4/2000 Horiguchi et al. ............ 326/83
6,492,857 B2 * 12/2002 Shuler, Jr. .................... 327/225

* cited by examiner

Primary Examiner—Tuan T. Lam
Assistant Examiner—Hiep Nguyen
(74) Attorney, Agent, or Firm—Perkins Coie LLP

(57) ABSTRACT

A low power, high speed D type flip flop is disclosed. The D type flip flop uses four inverters and four transmission gates to store and output the data states. The flip flop comprises two memory elements wherein each memory element is made up of a transmission gate and two inverters. Each of the four inverters contained in the flip flop is referred to as a bypass current limiting inverter. Each of the four inverters contains biasing circuitry to limit current flow and thereby save power. Additionally, each inverter has switching circuitry that enables the current limiting features to be automatically and advantageously bypassed thereby allowing for large currents and fast response times whilst simultaneously retaining the low power performance.

19 Claims, 6 Drawing Sheets

LOW POWER FLIP FLOP

FIELD OF THE INVENTION

The present disclosure relates to D type flip flops and more particularly to a low power, high efficiency flip flop capable of operating at high frequencies.

BACKGROUND OF THE INVENTION

Battery powered operation and low voltage digital circuits have motivated the design of low voltage and extremely efficient analog circuits. Analog integrated circuits are generally implemented using transistor based components which include logic devices. The capabilities of these transistor based circuits and logic devices have a substantial bearing on integrated circuit performance.

A conventional D-type flip flop is one example of a logic circuit contained on a fabricated integrated circuit Flip flops of this type would be used as registers and in applications such as frequency dividers, counters, shift registers (excluding the first, externally connected, element), state machines and so on.

A prior art D type flip flop 10 is shown in FIG. 1. As is conventional, the flip flop 10 has a "D" input signal line, an output line "Q", and inverted output line "QB", and a clock input terminal "CLOCK". The input into the D line is stored and output as a signal Q until the state of the flip flop is changed by applying a different signal on the D input and applying the clock signal.

The operation of a conventional prior art D type flip flop is described in reference to FIG. 2 The circuit in FIG. 2 is one example of how a D type flip flop may be realized using pass transistor based circuitry. As shown in FIG. 1, the flip flop 11 in FIG. 2 also has a "D" input signal line, an output line "Q", and inverted output line "QB", and a plurality of clock input terminals "C" and "CB". The clock and inverted clock signals C and CB are used to control a plurality of transmission gates within the flip flop 11. FIG. 2 contains tour CMOS inverters 12,14,16 and 18, four transmission gates TX1, TX2, TX3, and TX4, along with two inverters 13 and 15 used to produce the clock and inverted clock signals C and CB. The circuit is constructed so that inverters 12 and 14 along with transmission gate TX2 form a memory element. Similarly 16, 18 and TX4 form a second memory element. Both of these memory elements are capable of storing either a one or zero state.

Referring to FIG. 2, when a CLOCK signal is low, the transmission gate TX1 is on, while transmission gate TX2 is off. The signal present at the input D passes through TX1, 12 and 14, and is present at node 1. When TX3 is off, node 1 is isolated from node 2 and the output node Q and QB. Keeping nodes 1 and 2 electrically separated enables the memory elements to function independently. When TX4 is on, 16 and 18 are in closed feedback loop so 16,18 and TX4 are configured as a memory element, where Q and QB are the outputs of this memory element. When the CLOCK signal goes high, input D is isolated from the rest of the circuit. The last state of input D prior to the CLOCK going high is now latched by inverters 12, 14 and transmission gate TX2 (which is now ON). Transmission gate TX3 is now also on (TX4 is off), hence output Q is forced to the same logic level as the input pin D before the clock went high. This output state will be retained until a new level for D is latched by the CLOCK signal going through another low to high transition.

Referring to FIG. 3, circuit 20 illustrates a standard prior art CMOS inverter that may be used as the inverters in FIG. 2. This simple inverter contains an NMOS and PMOS transistor 22 and 21 respectively. This type of inverter produces an OUT signal that is an inversion or opposite of the IN signal. A drawback of this simple inverter is the cross-over currents (between the transistors 21 and 22) that are produced when the input to the circuit 20 changes. Ideally only one of the two transistors 21 or 22 should be on at any given time, however during an input transition, momentarily both transistors are on, allowing a high current to flow from the supply to ground. Cross-over current is wasted power, it contributes no useful function and should therefore be minimized or eliminated in applications where power consumption is of concern.

Referring to FIG. 4, another prior art inverter 30 is shown which has current limiting techniques added to improve the power consumption of the device. This circuit includes PMOS transistors MP1, MP2, MP3 and MP4. The inverter 30 also contains NMOS transistors MN1, MN2, MN3 and MN4. The function of this circuit is the same as that in FIG. 3, the signal output (at the OUT terminal) is an inversion of the signal coming into the circuit (applied to the IN terminal). When the incoming signal changes states, both the NMOS and PMOS transistors MN2 and MP2 may both be temporarily on thereby creating undesirable cross-over currents. In this circuit arrangement of FIG. 4, bias currents are set so that the cross currents between the NMOS and PMOS devices are limited As mentioned before, limiting the current will improve the power efficiency of the device In this circuit MP2 and MP2 form the inverter part of the circuit (as in FIG. 3). Transistors MP1 and MN1 are connected to function as current limiting devices Transistors MP3 and MP4 are used to set the bias currents for MP2, while MN3 and MN4 are used to set the bias current for MN2. The cross over currents between MP2 and MN2 are now limited to Ibias. The voltage between the gate and source electrodes of these devices is set using a current mirror such that the maximum drain-source current (Ids) is equal to the bias current Ibias. This inverter has crossover currents limited to Ibias, so is relatively power efficient. However, the speed of operation is determined by the current available to charge and discharge a capacitive load, which in FIG. 2B is now also limited to Ibias.

Besides cross-over currents, a second source of inefficiency exists which is common to all prior art D-type flip flops. This inefficiency arises because the possibility exists that the outputs of the 2 memory element stages will drive each other, giving rise to significant supply currents during clock transitions.

Therefore there exists a need for a low current, power efficient, D type flip flop that is capable of operating at high switching speeds.

SUMMARY OF THE INVENTION

A low power, high speed D-type flip flop is disclosed. The D type flip flop uses four inverters and four transmission gates to store and output the data states of the flip flop. The flip flop contains two memory elements wherein each memory element is formed from a transmission gate connected in parallel with two inverters. Each of the four inverters is referred to as a bypass current limiting inverter. Each of the four inverters contains biasing circuitry to limit current flow and thereby save power. Additionally, each inverter has switching circuitry that enables the current limiting features to be selectively bypassed thereby allowing for large currents and fast response times.

Each inverter stage of the flip flop is connected such that the preceding (in time) memory element configures the inverters in the following element to enable fast operations, yet limit crossover currents in each inverter The limiting current is determined to be a compromise between the maximum crossover current and the strength of the 'weak' side of the inverter (i.e., its resilience to having its output driven).

Finally, to avoid the outputs of the memory elements driving each other, the transmission gates are driven by non-overlapping clocks. Non-overlapping clocks eliminate the possibility of the outputs being momentarily connected together so that the states of the memory elements may be correctly latched as the output of the flip flop device.

Specifically, the flip flop of the present invention comprises a first access transmission gate in series with a first memory element comprising a second transmission gate connected in parallel with first and second bypass current limited inverter, a second memory element comprising a third transmission gate connected in parallel with a third and fourth bypass current limited inverter, a forth transmission gate connected between the first and second memory elements, wherein the first, second, third and fourth bypass current limited inverters comprise an NMOS and PMOS switching transistors, an NMOS and PMOS current biasing transistors, and an NMOS and PMOS current bypass transistors, wherein a current biasing transistor within the first, second, third, and fourth bypass current limited inverters is bypassed when a state of the first and second memory elements is changed Using the above apparatus, the present invention also discloses a method for controlling a flip flop comprising the acts of providing a first memory element in series with a second memory element, wherein each memory element stores a state, providing two bypass current limited inverters and a transmission gate in each of the first and second memory elements, providing a first and second switching transistor in each bypass current limited inverter, and limiting a current in the first switching transistor while simultaneously not limiting the current in the second switching transistor when a state of the memory elements is changed.

The method of the present invention further discloses wherein the current in the bypass current limited inverters contained in the first memory element are switched to a non-limited state by signals from the bypass current limited inverters contained in the second memory element and wherein the current in the bypass current limited inverters contained in the second memory element is switched to a non-limited state by signals from the bypass current limited inverters contained in the first memory element.

Therefore the present invention allows for current limiting techniques to save power and yet also allows for currents to be non-limited when switching the states of the memory elements.

DETAILED DESCRIPTION

Figure 1:
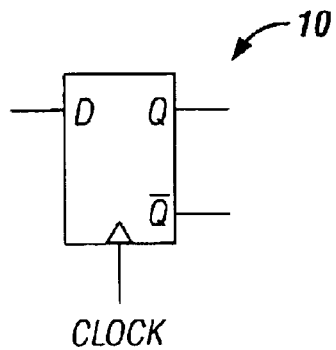
FIG. 1 shows a schematic views of a Prior Art D type flip flop.
Figure 2:
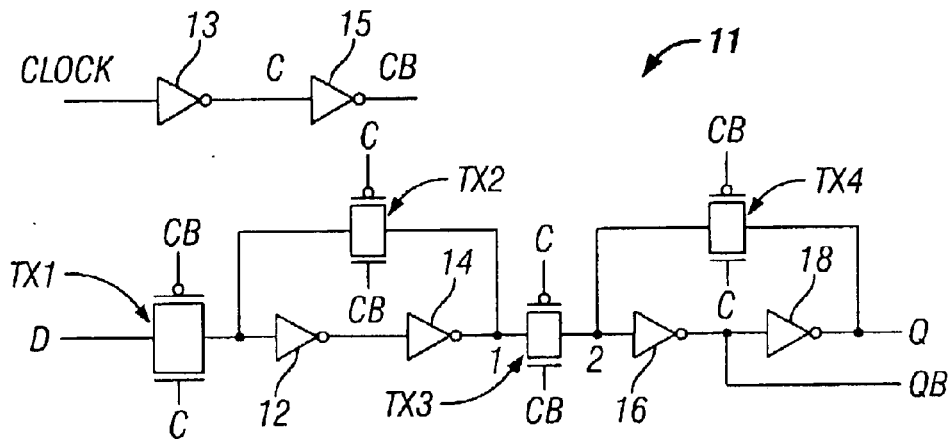
FIG. 2 is a schematic view of a Prior Art D type flip flop.

As described above, the present invention relates to a low power, high speed D-type flip flop. The D type flip flop uses four inverters and four transmission gates to store and output the data states of the flip flop. The flip flop contains two memory elements wherein each memory element is formed from a transmission gate connected in parallel with two inverters. Each of the four inverters is referred to as a bypass current limiting inverter. Each of the four inverters contains biasing circuitry to limit current flow and thereby save power. Additionally, each inverter has switching circuitry that enables the current limiting features to be selectively bypassed thereby allowing for large currents and fast response times.

Each inverter stage of the flip flop is connected such that the preceding (in time) memory element configures the inverters in the following element to enable fast operations, yet limit crossover currents in each inverter. The limiting current is determined to be a compromise between the maximum crossover current and the strength of the 'weak' side of the inverter (i.e., its resilience to having its output driven).

Finally, to avoid the outputs of the memory elements driving each other, the transmission gates are driven by non-overlapping clocks. Non-overlapping clocks eliminate the possibility of the outputs being momentarily connected together so that the states of the memory elements may be correctly latched as the output of the flip flop device.

Specifically, the flip flop of the present invention comprises a first access transmission gate in series with a first memory element comprising a second transmission gate connected in parallel with first and second bypass current limited inverter, a second memory element comprising a third transmission gate connected in parallel with a third and fourth bypass current limited inverter; a forth transmission gate connected between the first and second memory elements, wherein the first, second, third and fourth bypass current limited inverters comprise an NMOS and PMOS switching transistors, an NMOS and PMOS current biasing transistors, and an NMOS and PMOS current bypass transistors, wherein a current biasing transistor within the first, second, third, and fourth bypass current limited inverters is bypassed when a state of the first and second memory elements is changed Using the above apparatus, the present invention also discloses a method for controlling a flip flop comprising the acts of providing a first memory element in series with a second memory element, wherein each memory element stores a state providing two bypass current limited inverters and a transmission gate in each of the first and second memory elements; providing a first and second switching transistor in each bypass current limited inverter; and limiting a current in the first switching transistor while simultaneously not limiting the current in the second switching transistor when a state of the memory elements is changed.

The method of the present invention further discloses wherein the current in the bypass current limited inverters contained in the first memory element are switched to a non-limited state by signals from the bypass current limited inverters contained in the second memory element and wherein the current in the bypass current limited inverters contained in the second memory element is switched to a non-limited state by signals from the bypass current limited inverters contained in the first memory element.

Therefore the present invention allows for current limiting techniques to save power and yet also allows for currents to be non-limited when switching the states of the memory elements.

Figure 5:
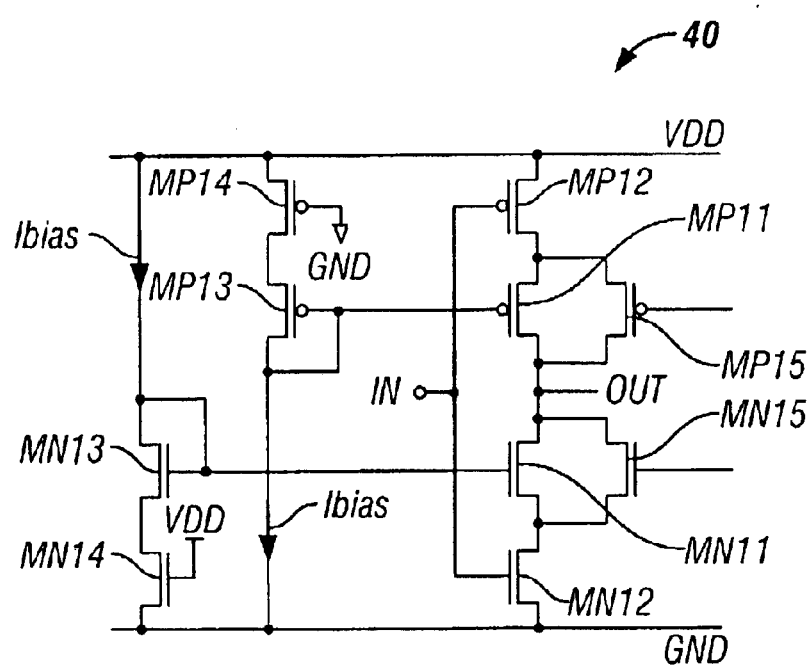
FIG. 5 is a schematic view of the bypass current limited inverter circuit of the present invention.

Referring to FIG. 5, inverter 40 illustrates one embodiment of the present invention. As mentioned above this circuit has both current limiting techniques added to improve the power consumption of the device along with current bypassing techniques to allow for fast switching. This circuit 40 includes PMOS transistors MP11, MP12, MP13, MP14 and MP15. The inverter 40 also contains NMOS transistors MN11, MN12, MN13, MN14 and MN15. In this embodiment, transistors MP12, MP11, MN11 and MN12 are all connected in series between VDD and ground GND. MP14 and MP13 are connected in series to provide a bias current Ibais, while MN13 and MN14 are also connected in series to provide another bias current bias. The function of this inverter circuit 40 is to output a signal at the OUT terminal that is an inversion of the signal coming into the circuit at the IN terminal. When the incoming signal changes states, both the NMOS and PMOS transistors MN12 and MP12 may both be temporarily on thereby creating undesirable cross-over currents. In this circuit arrangement of FIG. 5, bias currents are set so that the cross currents between the NMOS and PMOS devices are limited. As mentioned before, limiting the current will improve the power efficiency of the device.

Figure 3:
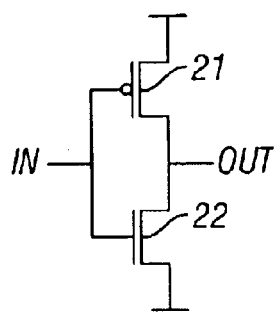
FIG. 3 is a schematic view of a Prior Art inverter circuit.
Figure 4:
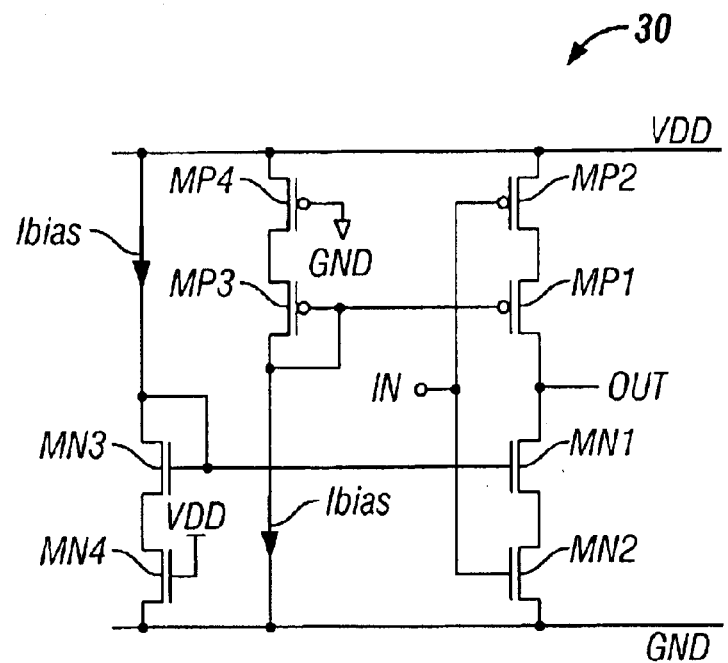
FIG. 4 is a schematic view of a Prior Art current limited inverter circuit.

In this circuit MP12 and MN12 form the inverter part of the circuit (as in FIG. 3). Transistors MP11 and MN11 are connected to function as current limiting devices. Transistors MP13 and MP14 are used to set the bias currents for MP12, while MN13 and MN14 are used to set the bias current for MN12. The cross over currents between MP12 and MN12 are now limited to Ibias. The voltage between the gate and source electrodes of these devices is set using a current mirror such that the maximum drain-source current (Ids) is equal to the bias current Ibias. This inverter 40 has crossover currents limited to Ibias, so is relatively power efficient. The speed of operation of an inverter is determined by the current available to charge and discharge a capacitive load, which in FIG. 5 would be limited to Ibias, however the switching transistors MN15 and MP15 allow these current limits to be bypassed.

In the circuit of FIG. 5, parallel switching devices have been added to the circuit to selectively bypass the bias current limiting sources. Transistors MP15 and MN15 are added as current bypass switching elements. As mentioned above, these transistors are used to bypass the current limiting features that slow down the response time of the inverter the circuit of FIG. 5 is referred to as a bypass current limited inverter as it has current limiting features and the ability to bypass the limiting currents when desired.

With respect to the bypassing features of the present invention, these techniques are also enacted when the inverter changes states. For example, if MN15 is switched on, and MP15 is switched off, then the unwanted crossover currents are still limited to Ibias (by virtue of MP12). When the input goes from low to high, the output can respond by going low in substantially the same time as an ordinary inverter. Because of the limited current capability of the current source to MP12, the switching threshold of the inverter is lower than the switching threshold of a standard inverter. With a finite rise-time on the input, this lower threshold level can be used to compensate for the added series device MN15 to give a similar transition time for this modified inverter as for a standard inverter as shown in FIG. 3. Therefore the inverter of FIG. 5, contains the advantages of current limiting devices and quick output switching capabilities.

Figure 6:
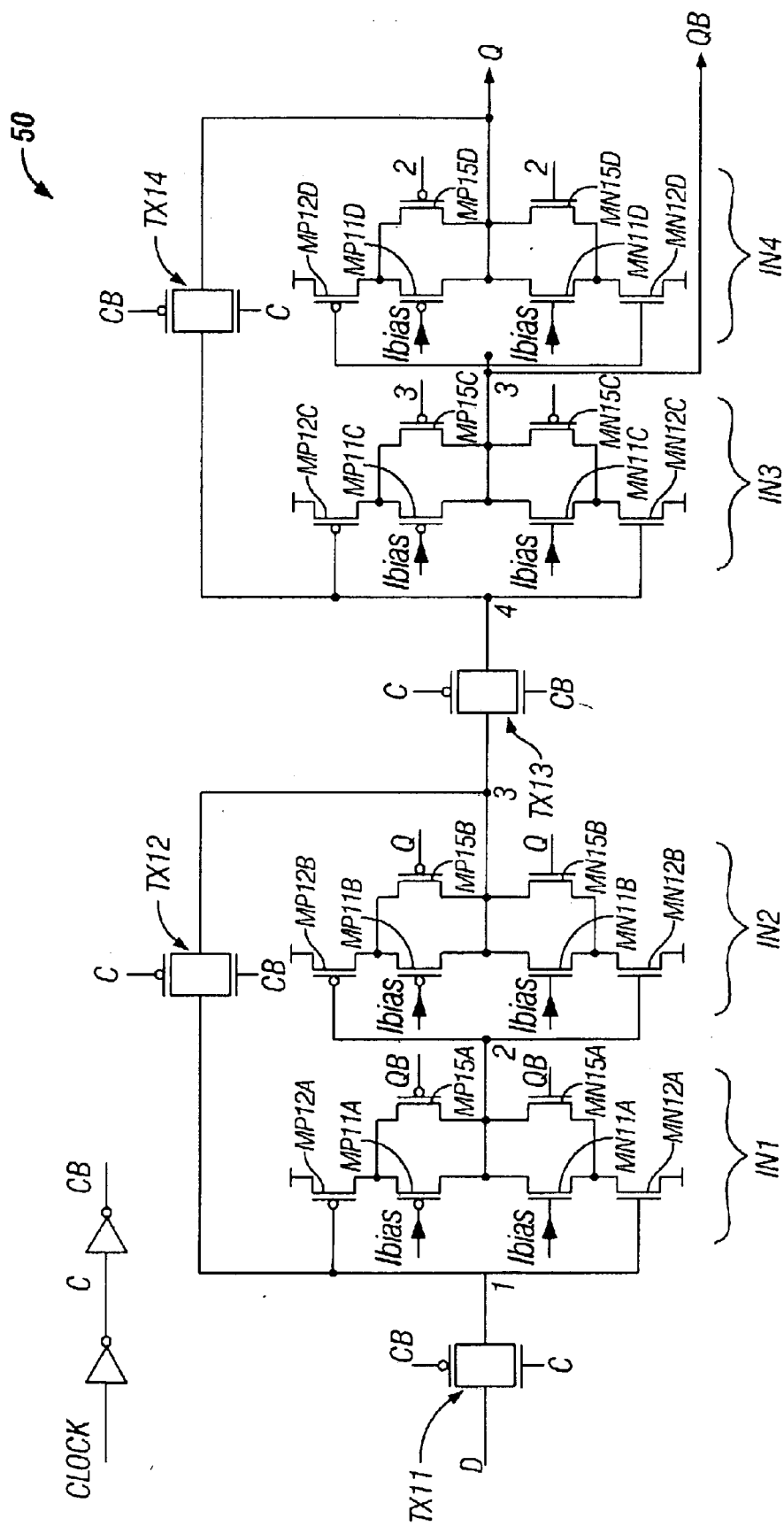
FIG. 6 is a schematic view of a D-type flip flop using the inverter circuits of FIG. 5.

Therefore the circuit 40 of FIG. 5 functions as an inverter circuit where the incoming signal IN becomes inverted at the output terminal OUT. For example, if the incoming signal is high, switching transistor MP12 is in a non-conducting state. This results in a low voltage at the output node of the circuit, thereby a low signal is outputted when a high signal is input. Conversely, when the input signal is low MP12 will be in a conducting state and the output state is high, thereby a low signal is inverted into a high signal as desired In FIG. 6, the preferred embodiment of the invention is shown. The circuit 50, functions as a D type flip flop that uses four of the bypass current limited inverter circuits as shown in FIG. 5. Specifically, inverters IN1, IN2, IN3 and IN4 are circuits (40) as shown in FIG. 5. The current biasing transistors are not shown in FIG. 6, however a gate bias voltage (Vbias) is shown as being produced by a circuit comprising transistors MP13, MP14, MN13 and MN14 as in FIG. 5 operated with a bias current of Ibias. All the inverters in FIG. 6 are the same, and for example IN1 contains transistors MP11A, MP12A, MP15A, MN11A, MN12A and MN15A. In a similar manner, inverter IN2 contains transistors MP11B, MP12B, MP15B, MN11B, MN12B and MN15B, inverter IN3 contains transistors MP11C, MP12C, MP15C, MN11C, MN12C and MN15C, and inverter IN4 contains transistors MP11D, MP12D, W15D, MN11D, MN12D and MN15D. In the first inverter IN1, transistors MP12A, MP11A, MN11A and MN12A are all connected in series between VDD and ground GND. Inverters IN2, IN3, and IN4 all have transistors connected in the same manner. In this embodiment inverters IN1 and IN2 along with transmission gate TX12 are connected to function as a memory element. Similarly, inverters IN3 and IN4 along with transmission gate TX14 are connected to function as a second memory element. Transmission gate TX13 is used to separate the first and second memory elements, while transmission gate TX11 is used to isolate the first memory element from the input of the flip flop (the D input terminal). The output of the flip flop circuit is Q. In this manner, the complementary actions of the first and second memory elements along with the transmission gates work in conjunction to function as a flip flop circuit.

In this embodiment, node 1 is the input to inverter IN1, node 2 is the output of IN1 and the input to IN2. Node 3 is the output of inverter IN2 which is isolated from node 4 by transmission gate TX13. Node 4 is the input to inverter IN3 and the output of IN3 is node QB. The input to inverter IN4 is node QB and the output of inverter IN4 is Q. Clock signals C and CB are also used in the circuit 50 as shown. For example when a CLOCK signal is low, the transmission gate TX11 is on, while transmission gate TX12 is off The signal (high or low) that is present on the input line D passes through nodes 1 and 2, through TX11, IN1 and IN2, and appears on node 3. When TX13 is off, node 3 is isolated from the output node Q and QB. The output of the flip flop is the value of the Q signal. In this manner the high or low state of the flip flop is stored or maintained by the first memory element.

When TX14 is on, IN3 and IN4 are in a closed feedback loop so IN3, IN4 and TX14 are configured as a second memory element. In this embodiment Q and QB are the outputs of this memory element. When the CLOCK signal goes high, input D is isolated from node 1 and the rest of the circuit. The last state of input D prior to the CLOCK going high is now latched by inverters IN1, IN2 and transmission gate TX12 (which is now ON). Transmission gate TX13 is now also on (TX14 is off), hence output Q is forced to the same logic level as the input pin D before the clock went high. This output state will be retained until a new level for D is latched by the CLOCK signal going through another low to high transition. In essence, each memory element maintains a high or low state until the D input is changed to function as a flip flop device.

In addition to the current limiting and bypassing techniques of the present invention, another novel feature of the present invention is that each inverter stage is connected such that the preceding (in time) memory element configures the inverters in the following element. This is to enable fast operations, yet limit crossover currents in each inverter to Ibias. As shown in FIG. 6, the control for the bypass switches (transistors MP15A and MN15A for example) is simply fed-forward from the previous (in time) sub-latch. For example the bypass transistors in inverters IN1 and IN2 are switched on using the flip flop output signals Q and QB. The inverters IN3 and IN4 are switched on using the outputs of inverters IN2 and IN1 found at nodes 3 and 2 in FIG. 6. For example, if IN3 and IN4 are latched by TX14 with Q high, then the only useful state of the input D is one that would force Q to go low on the next clock transition. Therefore, the inverter IN1 can be arranged such that is has a fast response to D going low, and IN2 can be arranged such that it has a fast response to node 2 going high. Similarly, inverters IN3 and IN4 will only change their state if D is low, hence IN3 can be configured to have a fast pull-up and IN4 can be configured such that it has a fast pull-down.

In summary, the bypass current limited inverters shown in FIG. 6 are configured and switched so that unwanted crossover currents are limited while simultaneously bypassing some of the current limiting transistors so as to not limit the switching capabilities of the inverter. It should also be noted that Ibias should be chosen to be a compromise between the maximum crossover current and the strength of the 'weak' side of the inverter (i.e., its resilience to having its output driven).

Figure 7:
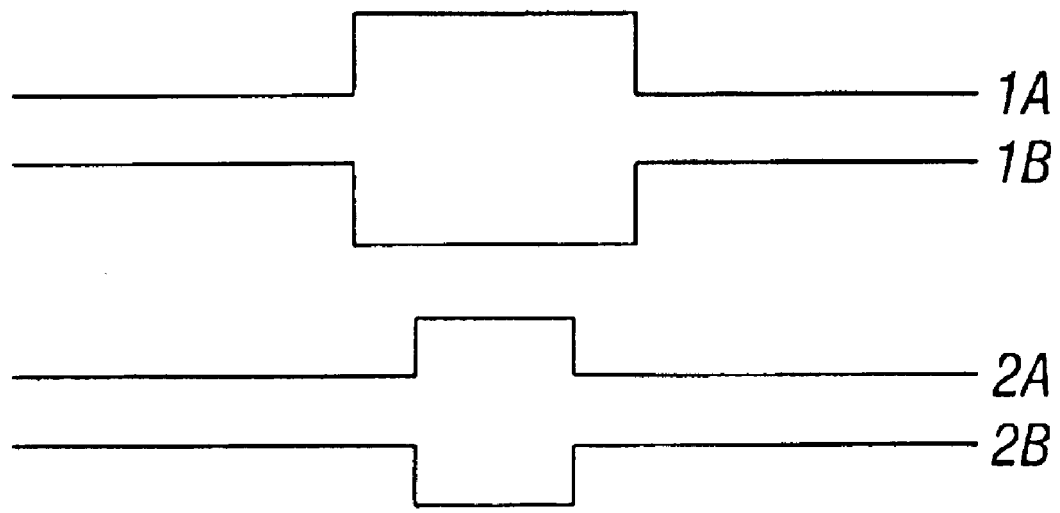
FIG. 7 shows an example of non-overlapping clocks used to control the circuit of FIG. 6.

Finally, to avoid the outputs of the first and second memory elements driving each other, the transmission gates are now driven by non-overlapping clocks. FIG. 7 shows an example of non-overlapping clocks. In this example clock signals 1A, 1B, 2A and 2B are produced. As shown, 2A is never a logic high at the same time as 1B, likewise, 2B is never a logic low at the same time as 1A, thereby these clocks are referred to as non-overlapping. Using this type of clocking scheme, this eliminates the possibility of the outputs being momentarily connected together Referring back to FIG. 6, transmission gates TX11 and TX14 would be driven or turned on using clock signal 2A. Transmission gates TX12 and TX13 would be activated by clock signal 1B. Using this method it is now ensured that inverter IN4 can not drive inverter IN2 as both TX13 and TX14 can not both be on at the same time. Similarly, inverter IN3 can not drive IN2 as TX11 and TX12 can not be on at the same time. There are many ways of generating these signals. For example, utilizing slow current controlled inverters, or it may be acceptable to generate the clocks in a more global manner using standard logic devices.

Figure 8:
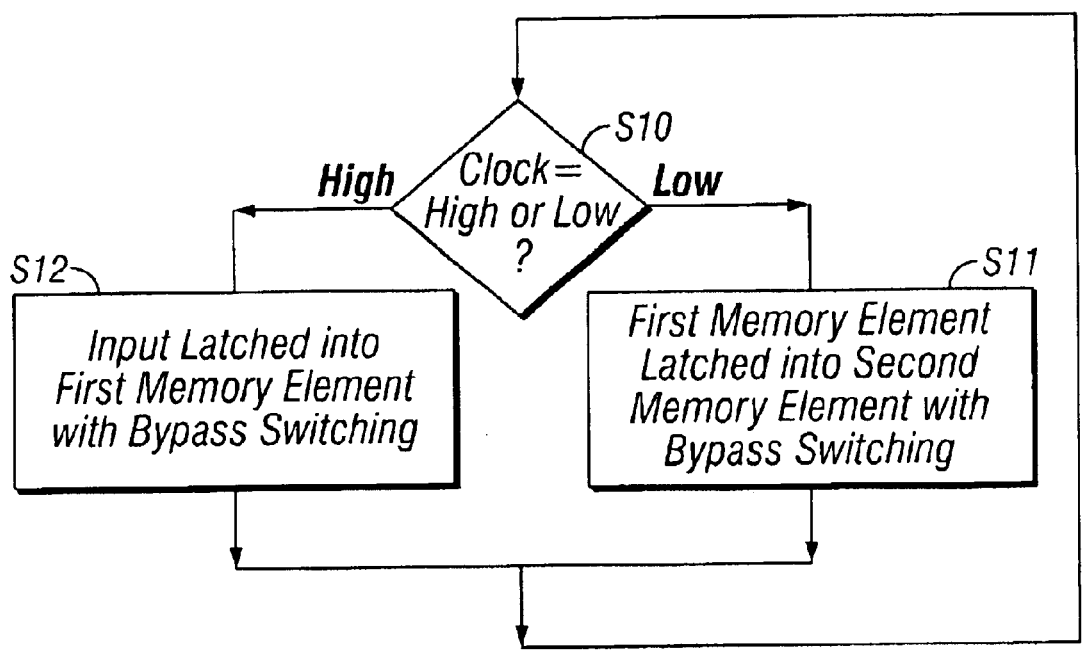
FIG. 8 shows a flowchart illustrating a method of the present invention.

Referring to FIG. 8, this flowchart illustrates the process by which the memory elements in the flip flop 50 act in conjunction with the CLOCK signals to pass the received data through the flip flop itself The process begins with step S10 where it is first determined if the CLOCK signal is high or low. If the signal is low, the data or signal contained in the first memory element is passed on to the second memory element through transmission gate TX13 in step S11. Also included in step S11 is the bypass switching signals from the other memory element as described above. For example, the current bypassing transistors in inverters IN3 and IN4 are switched from nodes 2 and 3 (in the first memory element) when the data comes from the first memory element into the second memory element. This allows for fast switching between memory elements when the states of the memory elements change. This state remains until the CLOCK signal changes states. When the CLOCK signal goes high in step S10, the input data passes through the first transmission gate and is latched in the first memory element in step S12. Also included in step S12 are the bypass signals coming from inverters IN3 and IN4. In this manner the data received at the input "D" terminal of the flip flop 50 is passed through the flip flop using the first and second memory elements.

Figure 9:
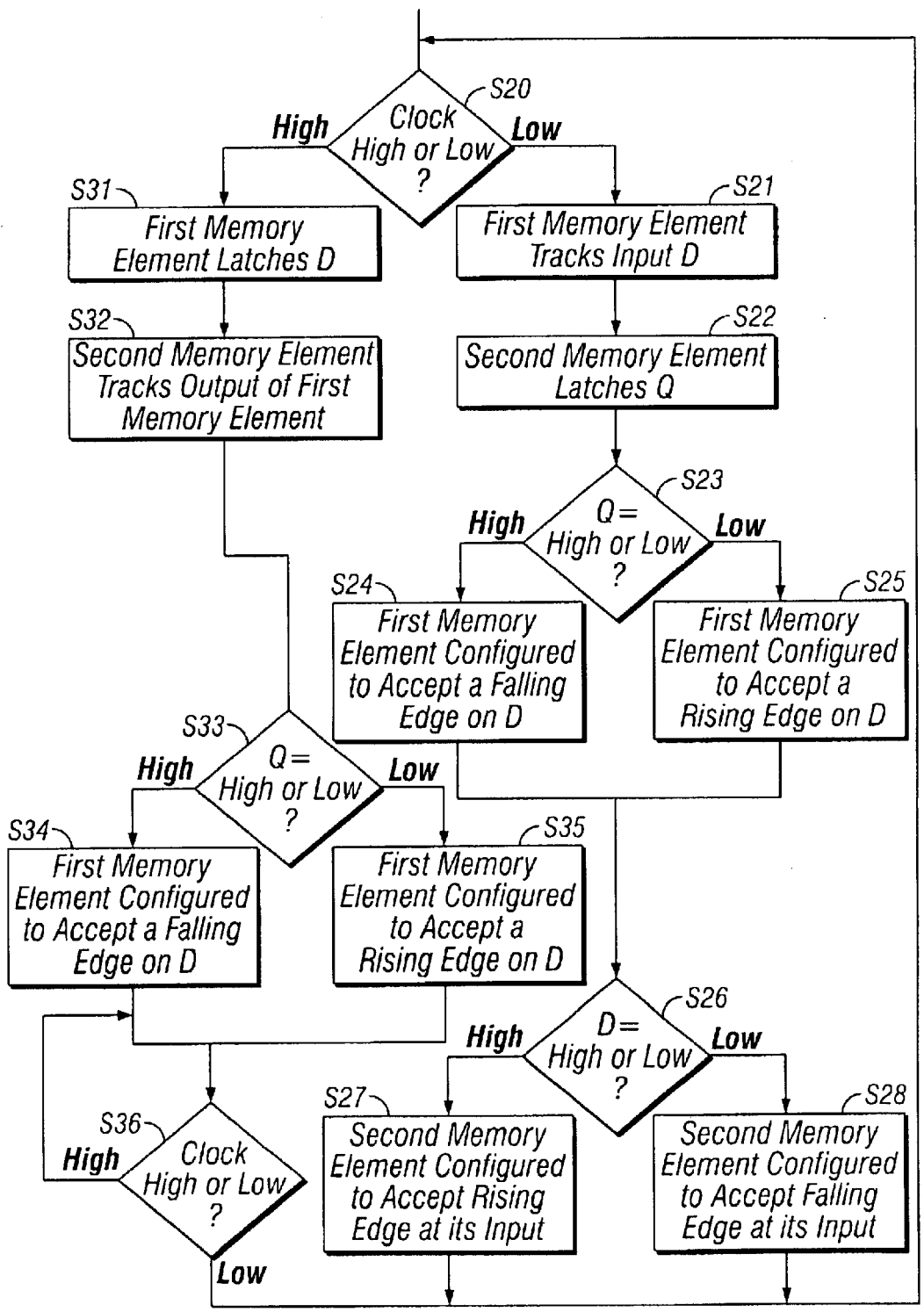
FIG. 9 shows a flowchart further illustrating a method of the present invention.

FIG. 9 is a more detailed flowchart of the process illustrated in FIG. 8. In addition to showing the passing of data through the first and second memory elements, FIG. 9 also details the bypass switching process in accordance with the flip flop "Q" and "D" values Comparing FIGS. 8 and 9, it can be seen that steps S21–S28 in FIG. 9 are equivalent to step S11 in FIG. 8, while steps S31–S36 in FIG. 9 are equivalent to step S12 in FIG. 8. The process begins with step S20 where it is first determined if the CLOCK signal is HIGH or LOW. If the signal is LOW, the process goes to step S21 and if the CLOCK is HIGH, the process goes to step S31. If the CLOCK was LOW, the first memory element tracks input "D" in step S21. In step S22 the second memory element latches the value "Q". In step S23 it is determined whether or not the value of "Q" is HIGH or LOW. If "Q" is HIGH in step S24 the first memory elements are configured to accept a falling edge on "D". If "Q" is low in step S25 the first memory elements are configured to accept a rising edge on "D". In step S26 it is determined if "D" is HIGH or LOW. If "D" is high in step S27 the second memory elements are configured to accept a rising edge on it's input. If "D" is LOW in step S28 the second memory elements are configured to accept a falling edge on it's input. In essence, steps S23 through S28 determine the bypass switching of the current limiting transistors within the inverters. Therefore by switching the inverters based on the determined current values of "Q" and "D", the inverters IN1, IN2, IN3 and IN4 in FIG. 6, can be switched in a manner so that the critical transitions (i.e. the second memory element changing from a one to zero state) are performed without current limiting techniques, thereby ensuring the fastest possible response time.

Still referring to FIG. 9, if the CLOCK signal then goes LOW, the first memory element latches input "D" in step S31. In step S32 the second memory element tracks the value "Q". In step S33 it is determined whether or not the value of "Q" is HIGH or LOW If "Q" is HIGH in step S34 the first memory elements are configured to accept a falling edge on "D". If "Q" is LOW in step S35 the first memory elements are configured to accept a rising edge on "D". In step S36 it is determined if the clock signal is HIGH or LOW. Therefore this state will remain until the CLOCK signal again goes LOW. This process therefore continuously takes input data at the "D" terminal and passes it from the first memory element to the second memory element as the CLOCK signals go from HIGH to LOW. Steps S33 through S35 determine the bypassing of current limiting within the inverters IN1, IN2, IN3, IN4 as desired to allow critical changes to happen quickly within the flip flop 50.

A limitation of the present invention can be seen by once again examining FIG. 6 If the CLOCK signal is low, such that TX11 is on, and Q is latched high, such that IN1 is configured to respond quickly to a falling edge on D, and IN2 is configured to respond to a rising edge on node 2. If, during this clock period, node D is taken low, then IN1 and IN2 subsequently respond quickly. If, however, in the same clock period, node D then goes high again, IN1 and IN2 are not able to respond quickly, rather they will respond at the rate determined by Ibias. This subsequently leads to a much longer setup time on node D if multiple input transitions are a possibility. Nodes 2 and 3 must be stable when the clock input rises, otherwise the latched state will not be a true representation of the level at the D input at the time of the clock transition.

For the reasons as described above, the flip flop of FIG. 6 is most suitable in applications where the D input can be guaranteed not to oscillate (make multiple transitions) during the low periods of the clock signal. This is actually not a severe restriction, as frequency dividers, any number of counter configurations, and more generalized state machines will tend to be of this nature. Other applications, such as a shift register forming part of a high speed serial interface, may be subject to multiple transitions for the first flip-flop element of the chain, but subsequent elements in the chain will not be subject to such multiple transitions. Therefore, a less efficient standard flip-flop is perhaps best used as the first element in the chain, with subsequent elements being of the type described in this invention as shown in FIG. 6.

The described embodiments are to be considered as illustrative and not restrictive, and the invention is not to be limited to the details given herein, but may be modified within the scope of the appended claims. In particular, it will be apparent to one skilled in the art that the inclusion of passive components in series with or substitution for the transistors of the disclosed embodiments is within the scope of the invention. The concept of predictive signaling from inverter to inverter as described could also be applied to predictive switching schemes between other types of devices such as NAND gates and any other type of digital gates or devices.

What is claimed is:

1. A flip flop device comprising:
   a first memory element comprising first and second bypass current limited inverters for storing a state, said first bypass current limited inverter having a first current limiting device, and said second bypass current limited inverter having a second current limiting device;
   a second memory element comprising third and fourth bypass current limited inverters for storing a state, said third bypass current limited inverter having a third current limiting device, and said fourth bypass current limited inverter having a fourth current limiting device; and
   wherein said first and second bypass current limiting devices are bypassed when the state of said first memory element is changed, and said third and fourth bypass current limiting devices are bypassed when the state of said second memory element is change.

2. A flip flop device as recited in claim 1 wherein the first and second bypass current limited inverters are connected in series.

3. A flip flop device as recited in claim 2 wherein the third and fourth bypass current limited inverters are connected in series.

4. A flip flop device as recited in claim 2 wherein a first transmission gate is connected between the first and the second memory elements.

5. A flip flop device as recited in claim 4 wherein a second transmission gate is connected in parallel with the first and the second bypass current limited inverters.

6. A flip flop device as recited in claim 4 wherein a third transmission gate is connected in parallel with the third the fourth bypass current limited inverters.

7. A flip flop device as recited in claim 5 wherein the first and second transmission gates are driven by non-overlapping clocks.

8. A flip flop device as recited in claim 7 wherein the first bypass current limited inverter comprises 3 NMOS and 3 PMOS transistors.

9. A flip flop device as in claim 1 wherein the current limiting device is a transistor.

10. A flip flop device comprising:
    a first memory element comprising a first transmission gate connected in parallel with first and second bypass current limited inverters;
    a second memory element comprising a second transmission gate connected in parallel with a third and fourth bypass current limited inverters;
    a third transmission gate connected between the first and second memory elements;
    wherein the first, second, third and fourth bypass current limited inverters each comprise NMOS and PMOS switching transistors, NMOS and PMOS current biasing transistors, and NMOS and PMOS current bypass transistors, wherein a current biasing transistor within each of the first and second bypass current limited inverters is bypassed when a state of the first memory element is changed, and wherein a current biasing transistor within each of the third and fourth bypass current limited inverters is bypassed when a state of the second memory element is changed.

11. A flip flop as recited in claim 10 wherein the current bypass transistors in the inverters in the first memory element are controlled from signals from the second memory element.

12. A flip flop as recited in claim 10 wherein the current bypass transistors in the inverters in the second memory element are controlled from signals from the first memory element.

13. A flip flop as recited in claim 10 wherein the first and second transmission gates are driven by non-overlapping clocks.

14. A method for controlling a flip flop comprising the acts of:
    providing a first memory element in series with a second memory element, wherein each memory element stores a state;
    providing two bypass current limited inverters and a transmission gate in each of the first and second memory elements; and
    providing a first and second switching transistor in each bypass current limited inverter; and
    limiting a current in the first switching transistor while simultaneously not limiting the current in the second switching transistor when a state of the memory elements is changed.

15. The method as recited in claim 14 wherein the current in the bypass current limited inverters contained in the first memory element are switched to a non-limited state by signals from the bypass current limited inverters contained in the second memory element.

16. The method as recited in claim 15 wherein the current in the bypass current limited inverters contained in the second memory element is switched to a non-limited state by signals from the bypass current limited inverters contained in the first memory element.

17. The method as recited in claim 14 further comprising the act of driving the transmission gates in the first and second memory elements with non-overlapping clocks.

18. The method as recited in claim 14 wherein the bypass current limited inverters comprise an NMOS and PMOS switching transistors, an NMOS and PMOS current biasing transistors, and an NMOS and PMOS current bypass switching transistors.

19. The method of controlling a flip flop comprising the acts of:

latching data from an input terminal to be stored in a first memory element when a clock signal is high;

latching data from the first memory element to be stored in a second memory element when a clock signal is low;

bypassing current limiting devices within the first memory element when a state of the memory element changes; and bypassing current limiting devices within the second memory element when a state of the second memory element changes.

* * * * *